(12) United States Patent
Makurin et al.

(10) Patent No.: US 10,802,375 B2
(45) Date of Patent: Oct. 13, 2020

(54) OPTICALLY-CONTROLLED SWITCH

(71) Applicant: Samsung Electronics Co., Ltd., Suwon-si, Gyeonggi-do (KR)

(72) Inventors: Mikhail Nikolaevich Makurin, Arkhangelsk (RU); Anton Sergeevich Lukyanov, Moscow (RU); Elena Aleksandrovna Shepeleva, Kostroma (RU); Artem Yurievich Nikishov, Moscow Region (RU)

(73) Assignee: Samsung Electronics Co., Ltd., Suwon-si (KR)

( * ) Notice: Subject to any disclaimer, the term of this patent is extended or adjusted under 35 U.S.C. 154(b) by 36 days.

(21) Appl. No.: 16/129,142

(22) Filed: Sep. 12, 2018

(65) Prior Publication Data

US 2019/0086763 A1   Mar. 21, 2019

(30) Foreign Application Priority Data

Sep. 15, 2017  (RU) ................................ 2017132257
May 29, 2018  (KR) ........................ 10-2018-0061311

(51) Int. Cl.
  *G02F 1/31*       (2006.01)
  *H01L 31/16*      (2006.01)
  (Continued)

(52) U.S. Cl.
  CPC .............. *G02F 1/31* (2013.01); *H01L 31/162* (2013.01); *H05K 1/0243* (2013.01); *H05K 1/115* (2013.01);
  (Continued)

(58) Field of Classification Search
  CPC .......... G02F 1/31; G02F 1/313; G02F 1/3131; H01L 31/161; H01L 31/162;
  (Continued)

(56) References Cited

U.S. PATENT DOCUMENTS 3,786,307 A *  1/1974  Robinson ................. G09G 3/30
                                                345/80
3,979,703 A   9/1976  Craven
       (Continued)

FOREIGN PATENT DOCUMENTS

EP       0 073 165 A1    3/1983
EP       1 143 562 A1   10/2001
       (Continued)

OTHER PUBLICATIONS

International Search Report dated Dec. 26, 2018; International Application Number: PCT/KR2018-010670.
(Continued)

*Primary Examiner* — John R Lee
(74) *Attorney, Agent, or Firm* — Jefferson IP Law, LLP

(57) ABSTRACT

An optically-controlled switch and a method therefor are provided. The optically-controlled switch includes a printed circuit board (PCB) including upper and lower layers and a dielectric layer between the upper and lower layers, a plurality of vias electrically connected to the upper and lower layers and located in at least two rows, a shunt via electrically connected to the lower layer and separated from the upper layer by a dielectric gap, and a photoconductive semiconductor element (PSE) electrically connected to the upper layer and the shunt via, wherein the PSE includes a dielectric state and a conductor state, and wherein an electromagnetic wave provided to the optically-controlled switch propagates or is blocked through a waveguide formed between the at least two rows.

18 Claims, 31 Drawing Sheets

(51) Int. Cl.
*H05K 1/11* (2006.01)
*H05K 1/02* (2006.01)

(52) U.S. Cl.
CPC .............. *H05K 2201/09609* (2013.01); *H05K 2201/10106* (2013.01); *H05K 2201/10121* (2013.01)

(58) Field of Classification Search
CPC ...... H05K 1/0243; H05K 1/115; H05K 1/116; H05K 2201/09609; H05K 2201/095; H05K 2201/09554; H05K 2201/09636; H05K 2201/10106; H05K 2201/10121; H05K 2201/10053
See application file for complete search history.

(56) References Cited

U.S. PATENT DOCUMENTS

| | | | |
|---|---|---|---|
| 4,028,650 A | 6/1977 | Konishi et al. | |
| 4,302,733 A | 11/1981 | Salzberg et al. | |
| 4,329,686 A | 5/1982 | Mourou | |
| 4,387,386 A | 6/1983 | Garver | |
| 5,142,255 A | 8/1992 | Chang et al. | |
| 5,291,056 A | 3/1994 | Howson | |
| 5,339,053 A | 8/1994 | Lux et al. | |
| 5,847,672 A * | 12/1998 | James | G01S 7/4052 342/5 |
| 6,313,803 B1 | 11/2001 | Manasson et al. | |
| 6,552,371 B2 | 4/2003 | Levine et al. | |
| 6,949,978 B2 | 9/2005 | Tayrani et al. | |
| 6,996,305 B2 | 2/2006 | Kim et al. | |
| 7,039,258 B2 | 5/2006 | Gunn, III et al. | |
| 7,088,874 B2 | 8/2006 | Pruneri et al. | |
| 7,885,492 B2 | 2/2011 | Welch et al. | |
| 7,969,001 B2 | 6/2011 | Rofougaran et al. | |
| 8,258,892 B2 | 9/2012 | Abhari et al. | |
| 8,269,344 B2 | 9/2012 | Rofougaran | |
| 8,274,147 B2 | 9/2012 | Rofougaran et al. | |
| 8,299,861 B2 | 10/2012 | Tatoian et al. | |
| 8,306,428 B2 | 11/2012 | Shi et al. | |
| 8,436,466 B2 | 5/2013 | Rofougaran et al. | |
| 8,450,846 B2 | 5/2013 | Rofougaran | |
| 9,035,838 B2 | 5/2015 | Le Bars et al. | |
| 9,059,495 B2 | 6/2015 | Ruiz-Cruz et al. | |
| 9,166,290 B2 | 10/2015 | Blech | |
| 9,496,610 B2 | 11/2016 | Blech | |
| 9,742,070 B2 | 8/2017 | Zhou et al. | |
| 10,436,980 B2 * | 10/2019 | Kleinert | G02F 1/011 |
| 10,447,261 B1 * | 10/2019 | Hughes | H01L 31/165 |
| 2003/0091287 A1 | 5/2003 | Lam et al. | |
| 2005/0201672 A1 | 9/2005 | Mansour et al. | |
| 2009/0066597 A1 | 3/2009 | Yang et al. | |
| 2010/0104236 A1 | 4/2010 | Keating | |
| 2013/0056842 A1 * | 3/2013 | Sullivan | G02F 1/0102 257/432 |
| 2015/0221804 A1 | 8/2015 | Curry et al. | |
| 2016/0054431 A1 | 2/2016 | Zou et al. | |
| 2017/0012335 A1 | 1/2017 | Boutayeb | |
| 2019/0086763 A1 * | 3/2019 | Makurin | H05K 1/115 |
| 2020/0007125 A1 * | 1/2020 | Lukyanov | H01P 1/15 |

FOREIGN PATENT DOCUMENTS

| | | |
|---|---|---|
| EP | 1 403 692 A1 | 3/2004 |
| EP | 2 551 920 A2 | 1/2013 |
| EP | 1 387 409 B1 | 4/2016 |
| JP | 2012-231292 A | 11/2012 |
| KR | 10-1750282 B1 | 6/2017 |
| WO | 2009/023551 A1 | 2/2009 |

OTHER PUBLICATIONS

Episkopou et al.; Optically-Controlled Plasma Switch for Integrated Terahertz 4PPLICATIONS; Plasma Science (ICOPS), 2012 Abstracts IEEE International Conference on, IEEE; Jul. 8, 2012; pp. 3P-43; XP032279329.

European Search Report dated Apr. 1, 2020; European Appln No. 18856918.0-1230 / 3612891 PCT/KR2018010670.

* cited by examiner

Side view

OFF state

OPTICALLY-CONTROLLED SWITCH

CROSS-REFERENCE TO RELATED APPLICATION(S)

This application is based on and claims priority under 35 U.S.C. § 119 of a Russian patent application number 2017132257, filed on Sep. 15, 2017, in the Russian Patent Office and Korean patent application number 10-2018-0061311, filed on May 29, 2018, in the Korean Intellectual Property Office, the disclosure of each of which are incorporated by reference herein in their entireties.

BACKGROUND

1. Field

The disclosure relates to a millimeter-wave optically-controlled switch for substrate integrated waveguides.

2. Description of Related Art

Constantly increasing user demand motivates rapid development of communication technologies. Currently, fifth generation (5G) millimeter-wave networks are being actively developed, which will feature higher performance metrics based on user experience, including such factors as high rate and energy efficiency.

The 5G networks and sensors for car navigation can change the scenario of wireless systems. New applications in millimeter-wave require adoption of a new class of circuits capable of integrating data transmission and having detection capabilities in one wireless device. Among available technologies, substrate integrated waveguide (SIW)-structures play an important role, because they have simple construction and manufacturing, low losses and full shielding in the mm-wave range, a saving method for incorporation into one dielectric substrate, no complex transitions or undesirable parasitic effects, an ideal basis for implementing wide frequency band, and convenience of integration with classic printed circuit board (PCB) technologies.

However, in practice, conventional switching technologies for incorporation into SIW structures have at least the following technical problems:

(1) very high complexity and, consequently, high cost of existing products for the mm-wave range (>10 GHz) (in particular, switches (micro electro mechanical systems (MEMS), PIN-diodes, devices on field-effect MOS transistors (MOSFETs)), and intersecting of radio frequency (RF) channel with bias and supply circuits in a SIW structure leads to increasing of RF losses; and (2) high complexity of the bias and supply circuits, as well as an overly large occupied PCB area with bulky components, that lead to difficult SIW integration.

Thus, for efficient use of SIW technologies for applications in the mm-wave range, there is a need to create appropriate switches, satisfying the following conditions: absence of additional transitions to regular striplines based on PCBs for integration of classic switch components to avoid losses (simple integration with SIW); low complexity and low cost of components for very high frequencies (up to 100 GHz); and simple bias and supply circuits to avoid parasitic effects and complexity of PCBs in the mm-wave range.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide are optically-controlled switches for efficiently controlling a millimeter-wave in a substrate integrated waveguide (SIW).

Additional aspects will be set forth in part in the description which follows and, in part, will be apparent from the description, or may be learned by practice of the presented embodiments.

In accordance with an aspect of the disclosure, an optically-controlled switch includes a printed circuit board (PCB) including upper and lower layers and a dielectric layer between the upper and lower layers, a plurality of vias electrically connected to the upper and lower layers and located in at least two rows, a shunt via electrically connected to the lower layer and separated from the upper layer by a dielectric gap, and a photoconductive semiconductor element (PSE) electrically connected to the upper layer and the shunt via, wherein the PSE includes a dielectric state and a conductor state, and wherein an electromagnetic wave provided to the optically-controlled switch propagates or is blocked through a waveguide formed between the at least two rows.

A distance between adjacent vias among the plurality of vias may be less than one tenth of a wavelength of the electromagnetic wave.

The at least two rows form waveguide walls, and a distance between the at least two rows may be larger than half of a wavelength of the electromagnetic wave.

The optically-controlled switch may further include an input port configured to input the electromagnetic wave and an output port configured to output the electromagnetic wave, wherein the input port is located at one end of the waveguide and the output port is located at another end of the waveguide.

When the PSE is in the dielectric state, the electromagnetic wave may propagate through the waveguide, and when the PSE is in the conductor state, the electromagnetic wave may be blocked.

The optically-controlled switch may further include a light source connected to the PSE and configured to provide light to the PSE, wherein, when the light is provided to the PSE, the PSE is in the conductor state, and when the light is not provided to the PSE, the PSE is in the dielectric state.

The light source may include a micro light-emitting diode (LED).

The PSE may include a metalized area, wherein the light source is connected to the metalized area, and wherein the optically-controlled switch further includes a protective dielectric coating configured to completely cover the light source and the PSE, a first feed conductor located inside the protective dielectric coating and configured to connect the metalized area to a control circuit, and a second feed conductor located inside the protective dielectric coating and configured to connect the light source and the control circuit, and wherein the first and second feed conductors are isolated from each other.

The optically-controlled switch may further include a control circuit connected to the light source and configured to control a state of the light source.

The optically-controlled switch may further include a dielectric transparent splitter located between the PSE and the light source, and a feed conductor located inside the dielectric transparent splitter and configured to connect the light source and the control circuit, wherein the feed conductor does not contact the PSE.

A size of a light spot of the light source may be 3 to 6 times less than a diameter of the PSE.

The optically-controlled switch may further include a plurality of resonant vias located between the shunt via and the plurality of vias and electrically connected to the upper and lower layers.

The PSE may be passivated.

The PSE may include a rectangular shape, and a width of the PSE may be equal to a diameter of the shunt via.

The PSE may include a cross-like shape, and an arm width of the PSE may be equal to a diameter of the shunt via.

The PSE may include a round shape, a diameter of the PSE may be larger than a diameter of the shunt via and larger than a diameter of the dielectric gap, and the PSE may completely overlap the shunt via and the dielectric gap.

The PSE may include a square shape, a side length of the PSE may be larger than a diameter of the shunt via and larger than a diameter of the dielectric gap, and the PSE may completely overlap the shunt via and the dielectric gap.

The PSE may include a round shape, a diameter of the PSE may be larger than a diameter of the shunt via and is equal to a diameter of the dielectric gap, and the PSE may completely overlap the shunt via and partially overlap the dielectric gap.

In accordance with another aspect of the disclosure, a method of an optically-controlled switch is disclosed. The method includes providing a printed circuit board (PCB) comprising upper and lower layers and a dielectric layer between the upper and lower layers, connecting a plurality of vias electrically connected to the upper and lower layers, arranging the plurality of vias in at least two rows, electrically connecting a shunt via to the lower layer, separating the shunt via from the upper layer by a dielectric gap, electrically connecting a photoconductive semiconductor element (PSE) to the upper layer and the shunt via, and at least one of propagating an electromagnetic wave provided to the optically-controlled switch or blocking the electromagnetic wave through a waveguide formed between the at least two rows, wherein the PSE includes a dielectric state and a conductor state.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

First, the terms used in the present disclosure will be briefly described below before various embodiments of the present disclosure are described in greater detail.

Most of the terms used herein are general terms that have been widely used in the technical art to which the present disclosure pertains. However, some of the terms used herein may be created reflecting intentions of technicians in this art, precedents, or new technologies. Also, some of the terms used herein may be arbitrarily chosen by the present applicant. In this case, these terms are defined in detail below. Accordingly, the specific terms used herein should be understood based on the unique meanings thereof and the whole context of the present disclosure.

In the present specification, it should be understood that the terms, such as 'including' or 'having,' etc., are intended to indicate the existence of the features, numbers, steps, operations, actions, components, parts, or combinations thereof disclosed in the specification, and are not intended to preclude the possibility that one or more other features, numbers, steps, operations, actions, components, parts, or combinations thereof may exist or may be added. Also, the terms, such as 'unit' or 'module', etc., should be understood as a unit that processes at least one function or operation and that may be embodied in a hardware manner, a software manner, or a combination of the hardware manner and the software manner.

Figure 1A:
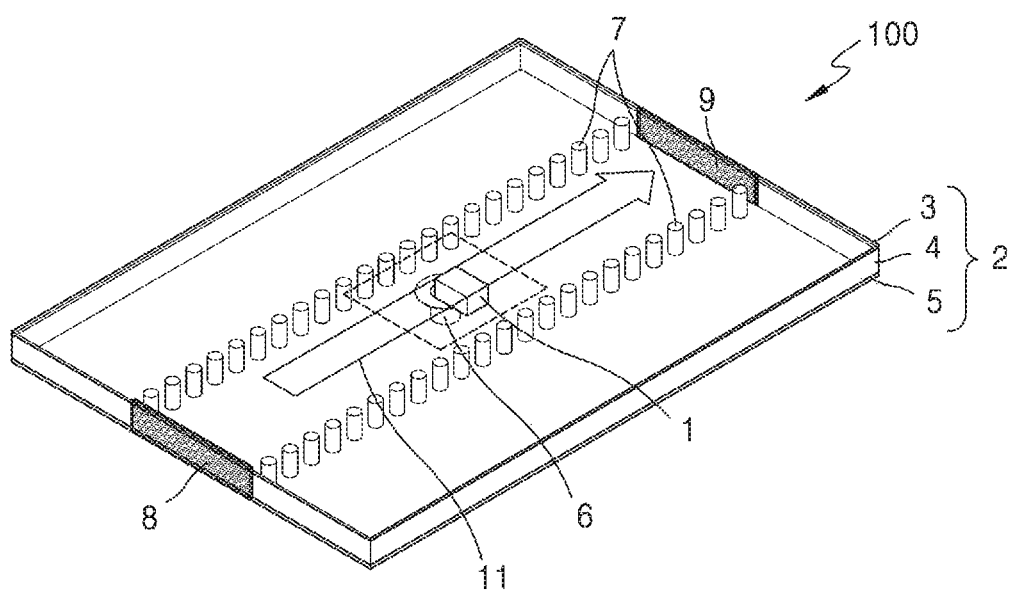
FIGS. 1A and 1B show an optically-controlled switch according to an embodiment of the disclosure.
Figure 1B:
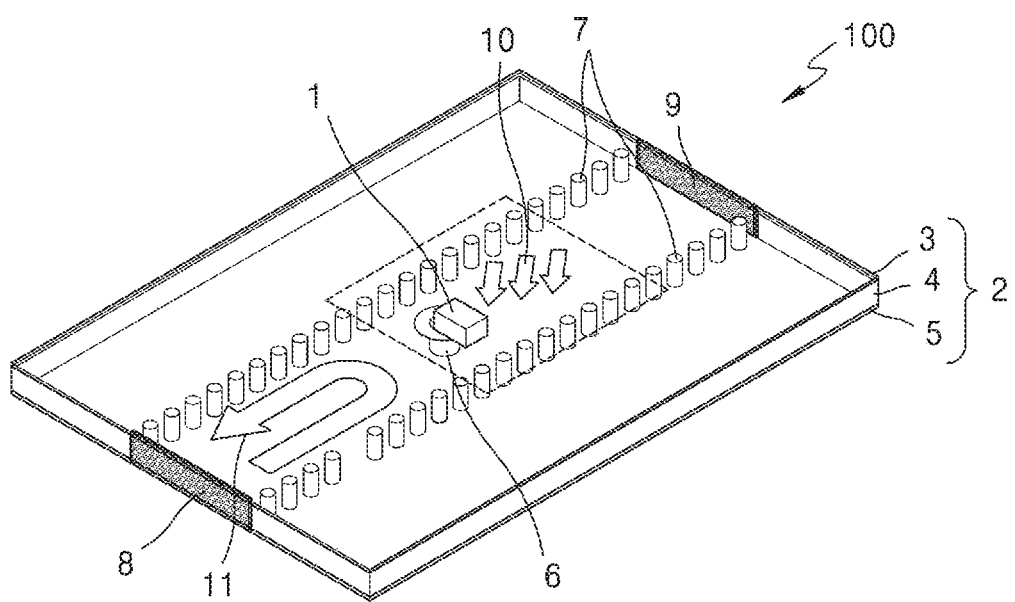

FIGS. 1A and 1B show an optically-controlled switch 100 according to an embodiment of the disclosure.

The optically-controlled switch 100 according to an embodiment may include a photoconductive semiconductor element (PSE) 1 and a printed circuit board (PCB) 2.

The PCB 2 may include an upper layer 3 and a lower layer 5 and, a dielectric layer 4 between the upper layer 3 and the lower layer 5. The upper layer 3 and the lower layer 5 may be metalized layers. As shown in FIGS. 1A and 1B, a plurality of vias 7 may be located on the PCB 2 and may be formed of a metallic material. Also, the plurality of vias 7 may be arranged in two parallel rows. The two rows may form walls of a substrate integrated waveguide (SIW). Thus, the SIW may be formed between the two rows and may include a first port 8 and a second port 9 respectively in both ends thereof. The first port 8 may be an input port of an electromagnetic (EM) wave 11 provided to the optically-controlled switch 100 according to an embodiment. The second port 9 may be an output port of the EM wave 11 provided to the optically-controlled switch 100.

Also, a distance between the two rows may be determined based on limitations on the waveguide width. For example, the distance may be larger than half of a wavelength of the EM wave 11 propagating along the waveguide taking into account dielectric filling of the waveguide.

Also, a distance between adjacent vias among the plurality of vias 7 may be less than one tenth of the wavelength of the EM wave 11 to prevent passing of the EM wave 11.

Also, a shunt via 6 may be located between the SIW walls (the two rows) and may be in the middle between the waveguide walls. The shunt via 6 may have direct contact with the lower layer 5, but does not contact directly with the upper layer 3 of the PCB 2 and may be separated therefrom by a dielectric gap (not shown in FIGS. 1A-1B).

Meanwhile, the PSE 1 may be mounted on the PCB 2 and may connect the shunt via 6 and the upper layer 3 of the PCB 2 to each other.

When light 10 is not provided to the PSE 1, the PSE 1 may be in a dielectric state, the shunt via 6 may be inactive. Thus, as shown in FIG. 1A, the EM wave 11, which is provided to the SIW through the first port (the input port) 8, may almost without losses pass to the second port (the output port) 9, while not experiencing refraction or reflection in a point where the PSE 1 and the shunt via 6 are located.

Meanwhile, when the light 10 is provided to the PSE 1, the PSE 1 may be in a conducting state, and the shunt via 6 may become active. When the shunt via 6 is active, the upper layer 3, the shunt via 6, and the lower layer 5 may be electrically connected. Current may flow a closed loop formed by the upper layer 3, the shunt via 6, the lower layer 5, and the vias 7. As a result, the EM wave 11 provided in the SIW through the first port (the input port) 8 may be reflected in the point where the PSE 1 and the shunt via 6 are located and may not pass to the second port (the output port) 9.

Thus, the PSE 1 and the shunt via 6 may play the role of the optically-controlled switch 100 operating based on photoconductive effect with respect to the SIW. Also, bias/supply isolation circuits of the optically-controlled switch 100 may be insulated from an RF path. An mm-wave waveguide system according to an embodiment may be controlled by changing the power of provided light. Also, the optically-controlled switch 100 according to an embodiment may have low losses even on high frequencies and may not subjected to interferential influence of external components, thereby reducing power consumption. Further, the optically-controlled switch 100 according to an embodiment may be easily integrated in any required location of the SIW. Also, the optically-controlled switch 100 according to an embodiment may have a wide working frequency band.

Figure 2A:
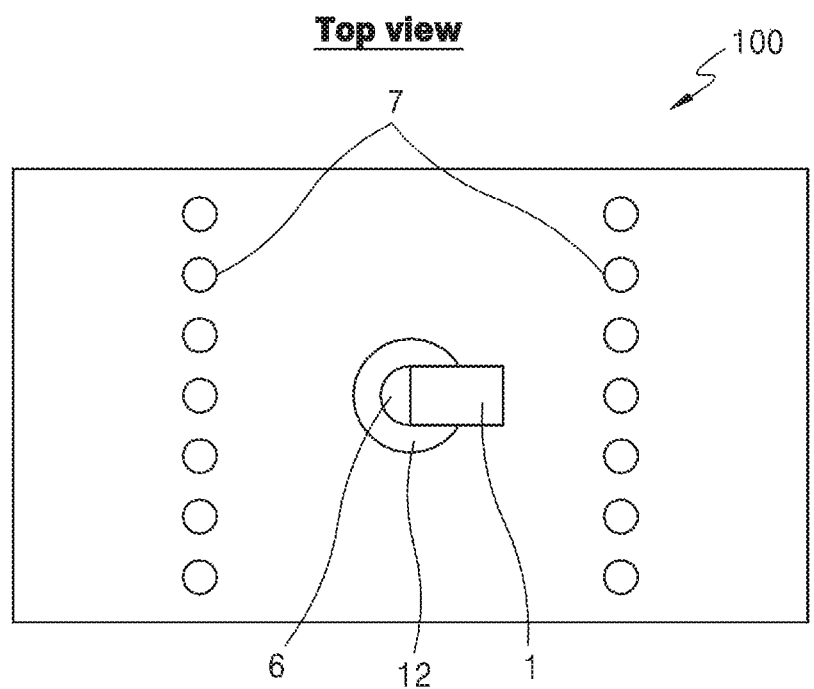
FIG. 2A shows a top view of an optically-controlled switch according to an embodiment of the disclosure.

FIG. 2A shows a top view of the optically-controlled switch 100 according to an embodiment of the disclosure.

Figure 2B:
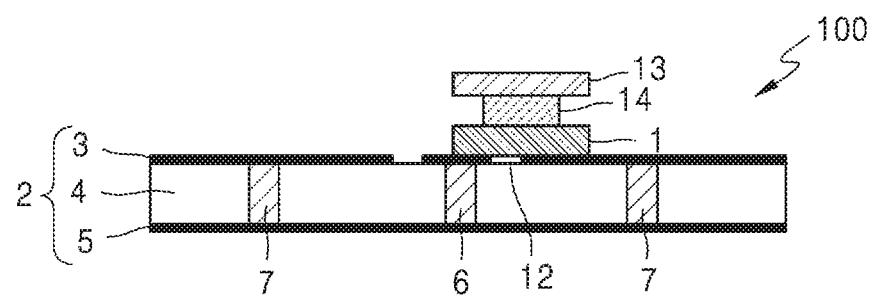
FIG. 2B shows a side view of the optically-controlled switch according to an embodiment of the disclosure.

FIG. 2B shows a side view of the optically-controlled switch 100 according to an embodiment of the disclosure.

Referring to FIGS. 2A and 2B, the optically-controlled switch 100 according to an embodiment may include the PCB 2, the plurality of vias 7, the shunt via 6, the dielectric gap 12, the PSE 1, a light source 14, and a control circuit 13.

Referring to FIG. 2A, the shunt via 6 may be separated from the upper layer 3 of the PCB 2 by the dielectric gap 12. Also, the PSE 1 may connect the shunt via 6 and the upper layer 3 to each other. Also, referring to FIG. 2B, the light source 14 may be located on the PSE 1 and may provide light to the PSE 1. At this time, the light source 14 may be a microLED (uLED) but is not limited thereto. Also, switching-on and switching-off of the light source 14 may be performed by the control circuit 13.

Figure 3A:
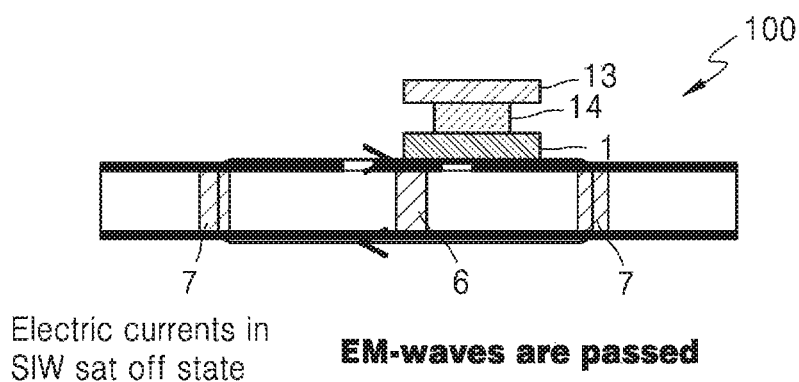
FIG. 3A shows an OFF state of an optically-controlled switch according to an embodiment of the disclosure.

FIG. 3A shows an OFF state of the optically-controlled switch 100 according to an embodiment of the disclosure.

Figure 3B:
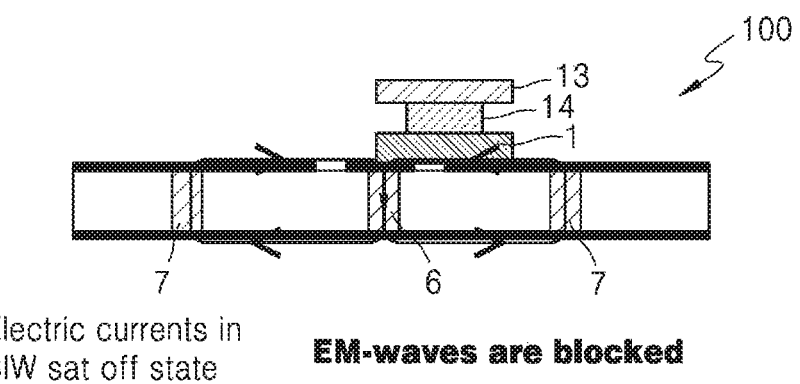
FIG. 3B shows an ON state of the optically-controlled switch according to an embodiment of the disclosure.

FIG. 3B shows an ON state of the optically-controlled switch 100 according to an embodiment of the disclosure.

Referring to FIG. 3A, when no light is provided to the PSE 1 (when a light source is in an OFF state), the PSE 1 may be in a dielectric state. When the PSE 1 is in the dielectric state, the shunt via 6 may not be electrically coupled with the upper layer 3 of the PCB 2, and electric currents may flow through the vias 7, the upper layer 3, and the lower layer 5 of the PCB 2 (shown by arrows). At this time, no electric current flows through the shunt via 6. Accordingly, when the optically-controlled switch 100 according to an embodiment is in the OFF state, electromagnetic waves provided to a SIW may not be reflected from a point where the shunt via 6 is located and may freely pass through the SIW.

Referring to FIG. 3B, when light is provided to the PSE 1 (when the light source is in an ON state), the PSE 1 may be in a conducting state. When the PSE 1 is in the conducting state, the shunt via 6 may be electrically coupled with the upper layer 3 through the PSE 1. Thus, electric currents may flow through the vias 7, the upper layer 3, the PSE 1, the shunt via 6, and the lower layer 5 (shown by arrows). Accordingly, when the optically-controlled switch 100 according to an embodiment is in the ON state, electromagnetic waves provided to the SIW may be reflected from the point where the shunt via 6 is located and may not pass through the SIW.

Figure 4:
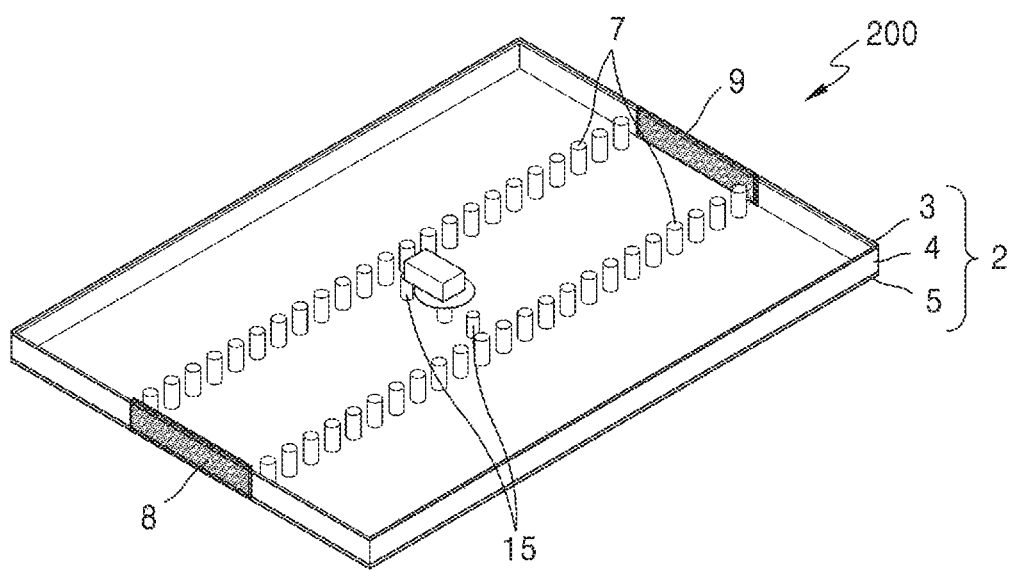
FIG. 4 shows an optically-controlled switch according to an embodiment.

FIG. 4 shows an optically-controlled switch 200 according to an embodiment of the disclosure.

Figure 5:
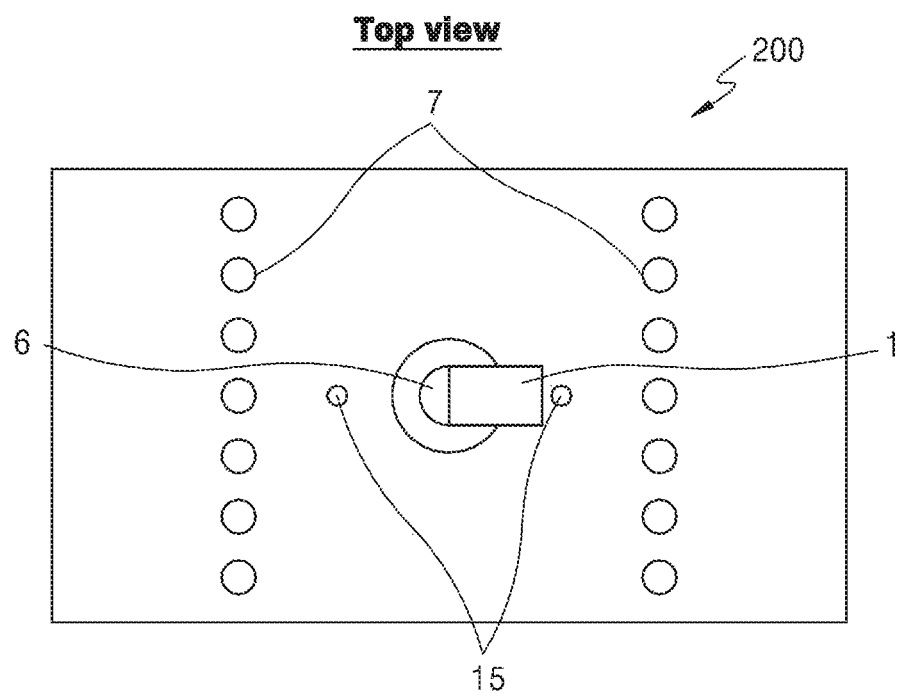
FIG. 5 shows a top view of the optically-controlled switch of FIG. 4.

FIG. 5 shows a top view of the optically-controlled switch 200 of FIG. 4.

The optically-controlled switch 200 according to an embodiment may include the PCB 2, the PSE 1, the plurality of vias 7, the first port 8, the second port 9, the dielectric gap 12, the light source 13, and the control circuit 14, as shown and described in FIGS. 1A through 3B, and may further include at least one resonant vias 15. The resonant vias 15 may be located between the shunt via 6 and SIW-waveguide walls (e.g. rows formed by the plurality of vias 7). Also, the resonant vias 15 may be formed of a metallic material. Also, the resonant vias 15 may not contact with the PSE 1.

The PSE 1 may have self-capacitance. The resonant vias 15 and the shunt via 6 may have inductance properties. Accordingly, the resonant vias 15 and the PSE 1 may form a resonant circuit in some frequency bands. This will be described in more detail with reference to FIGS. 6A and 6B.

Figure 6A:
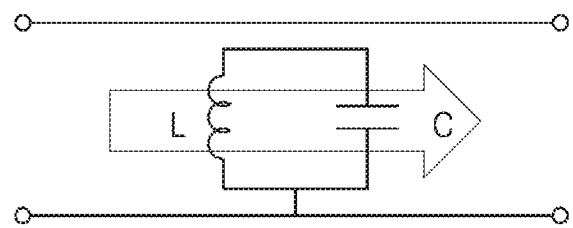
FIG. 6A shows a resonant circuit formed in an ON state of the optically-controlled switch of FIG. 4.
Figure 6A:
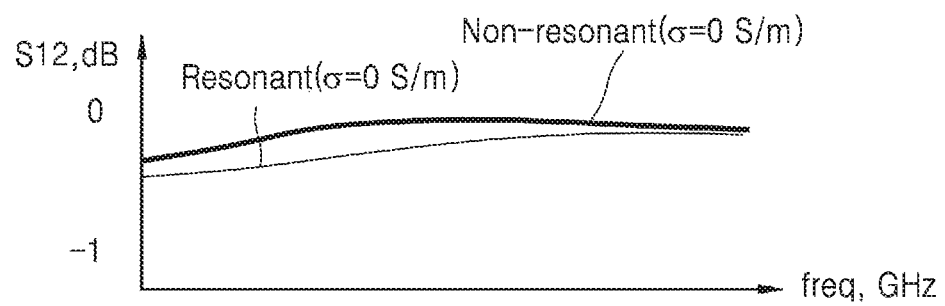

FIG. 6A shows a resonant circuit formed in an ON state of the optically-controlled switch 200 of FIG. 4.

Figure 6B:
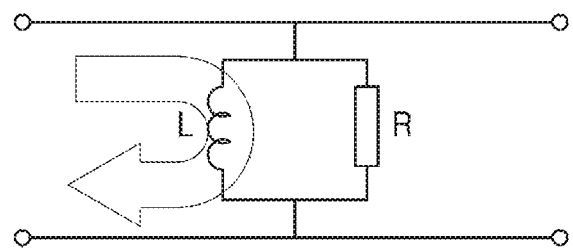
FIG. 6B shows a resonant circuit formed in an OFF state of the optically-controlled switch of FIG. 4.
Figure 6B:
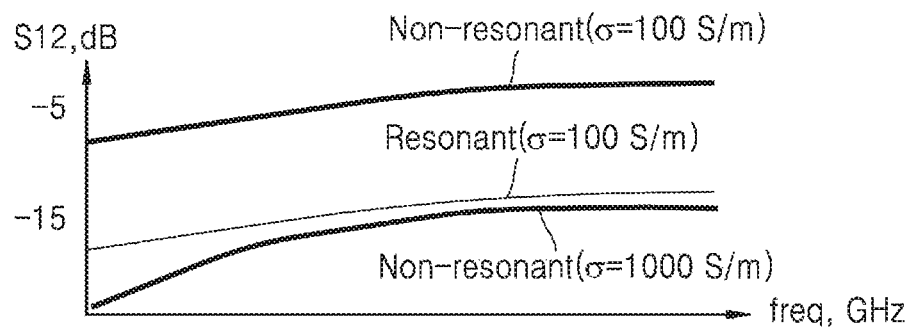

FIG. 6B shows a resonant circuit formed in an OFF state of the optically-controlled switch 200 of FIG. 4.

Figure 7:
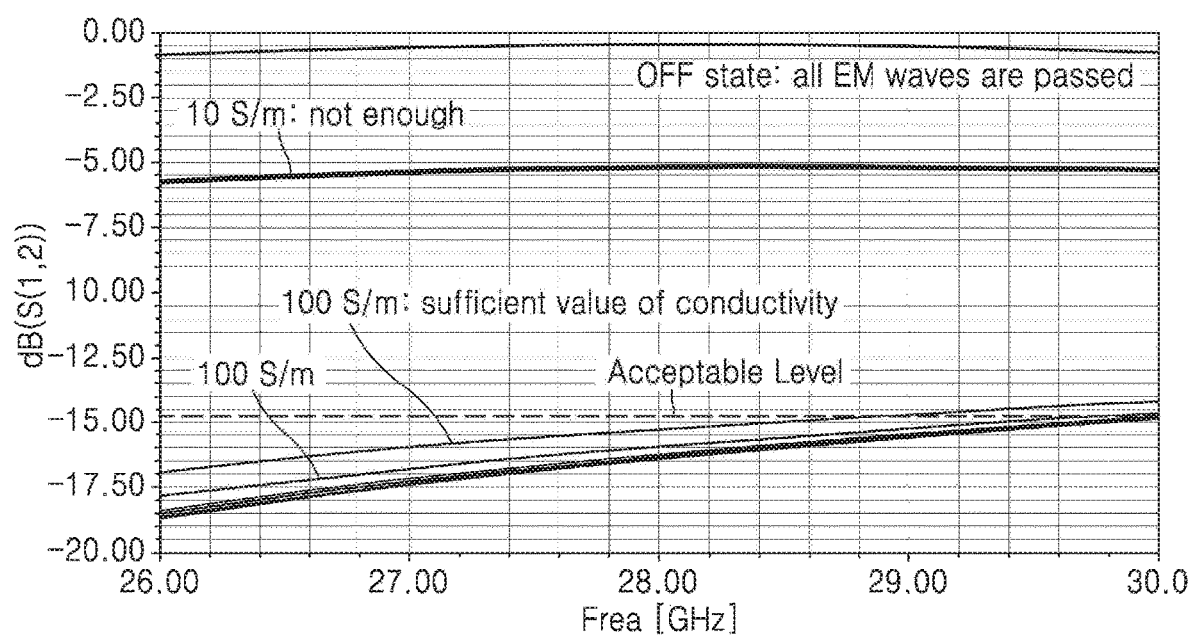
FIG. 7 is a graph of the dependency of a transfer coefficient on a frequency of the optically-controlled switch of FIG. 4.

FIG. 7 is a graph of the dependency of a transfer coefficient on a frequency of the optically-controlled switch 200 of FIG. 4.

Referring to FIG. 6A, when light is not provided to the PSE 1 of FIG. 4 (when a light source is in an OFF state), a contact area of the PSE 1, the dielectric gap 12, and the shunt via 6 may have the same effect as a capacitance element C, and the resonant vias 15 and the shunt via 6 may have the same effect as an inductance element L. As shown in FIG. 6A, when the optically-controlled switch 200 is in the OFF state, the resonant circuit having a high factor Q may arise. Also, since the capacitance element C and the inductance element efficiently compensate each other, electromagnetic waves may pass through the SIW with only low losses.

Referring to FIG. 6B, when light is provided to the PSE 1 of FIG. 4 (when the light source is in an ON state), the PSE 1 may have the same effect as a resistance element R, and the resonant vias 15 and the shunt via 6 may have the same effect as the inductance element L. In this case, the inductance element L may not be compensated and become a mismatching element in a waveguide, and, as a result, electromagnetic waves may be reflected. When the optically-controlled switch 200 is compared to the optically-controlled switch 100 of FIGS. 1A-3B, the optically-controlled switch 200 may provide a state of full reflection of EM waves even when the PSE 1 has lower conductance. Also, since intensity of the light provided to the PSE 1 is linearly associated with the conductance of the PSE 1, the optically-controlled switch 200 may provide the state of full reflection of EM waves even when the light having lower intensity is provided.

For example, referring to a graph of FIG. 6B, in a resonant state with the conductance of the PSE 1 of about 100 Sm/m, and in a non-resonant state with the conductance of the PSE 1 of about 1000 Sm/m, the same transfer coefficient S12 may be provided, whereas in the non-resonant state with the conductance of the PSE 1 of about 1000 Sm/m, a transfer coefficient S12 of approximately −15 dB may be provided.

When compared with the same conductance (about 100 Sm/m), the transfer coefficient may have a difference of about 10 dB in the non-resonant state and in the resonant state.

Thus, when the optically-controlled switch 200 (including the resonant vias 15) of FIG. 4 is compared to the optically-controlled switch 100 (including no resonant via) described in FIGS. 1A-3B, for placing the optically-controlled switch 200 in the ON state (for implementing a given cut-off level of the SIW), the requirements to the necessary conductance of the PSE 1 may be reduced 10-times, and intensity of the provided light may be reduced approximately 10 times compared to the optically-controlled switch 100 (including no resonant via) described in FIGS. 1A-3B. Accordingly, the optically-controlled switch 200 (including the resonant vias 15) may provide high sensitivity in conditions of low light and low energy consumption.

Also, referring to FIG. 7, the optically-controlled switch 200 (including the resonant vias 15) of FIG. 4 may demonstrate positive properties in narrower frequency band than the optically-controlled switch 100 (including no resonant via) described in FIGS. 1A-3B.

Figure 8:
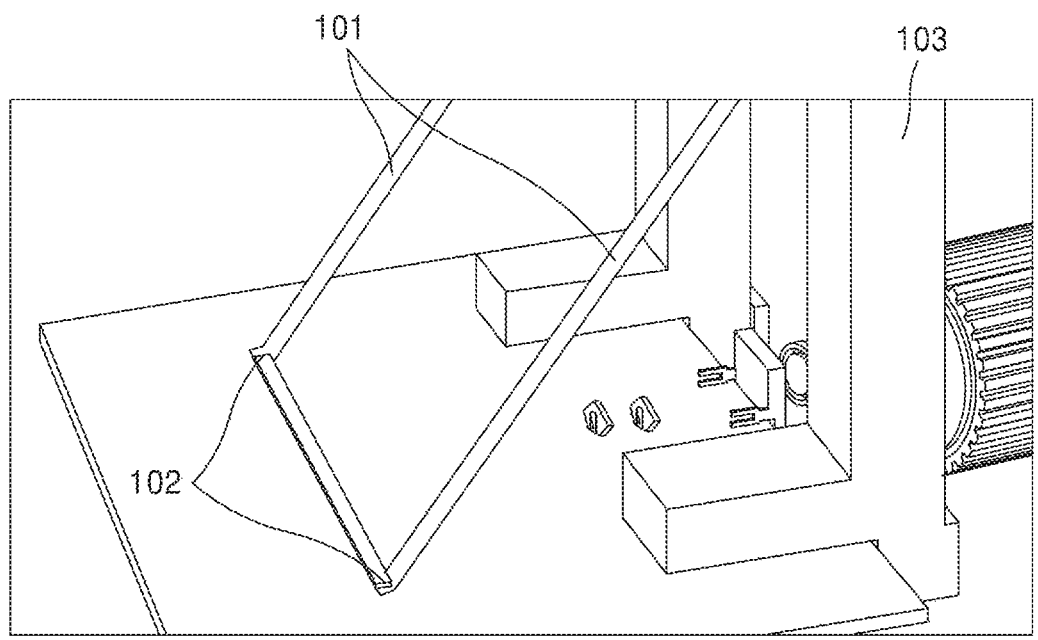
FIG. 8 shows an example of an optically-controlled switch according to the related art.

FIG. 8 shows an example of an optically-controlled switch according to the related art.

Referring to FIG. 8, since in a conventional optically-controlled switch, big light intensity is required, fiber optic cables 101 or lasers may be used to provide light to a PSE 102. Also, a bulky supporting system 103 may be required for all structure together with powerful light sources.

Unlike a conventional optically-controlled switch, an optically-controlled switch according to an embodiment of the present disclosure may not require high light intensity. Thus, the optically-controlled switch according to an embodiment may use microLEDs (uLEDs) as light sources, and light intensity of the uLEDs may sufficiently operate the optically-controlled switch. A light source (e.g. uLEDs) providing light to a PSE will be described in more detail with reference to FIGS. 9A-9C.

Figure 9A:
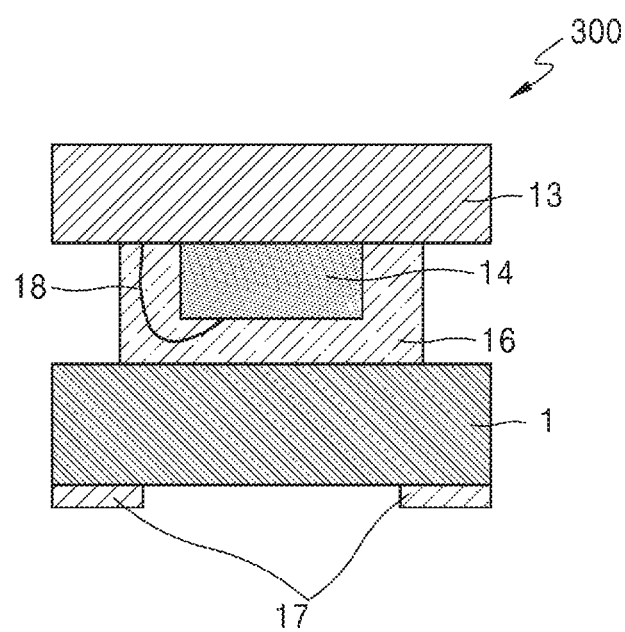
FIGS. 9A, 9B, and 9C are diagrams for explaining a light source providing light to a photoconductive semiconductor element (PSE) according to various embodiments of the disclosure.
Figure 9B:
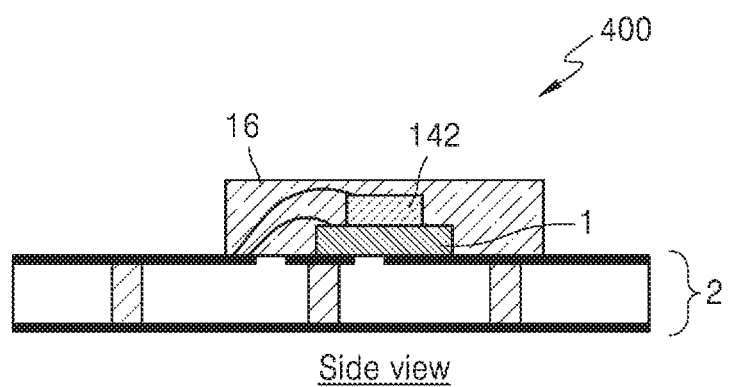
Figure 9C:
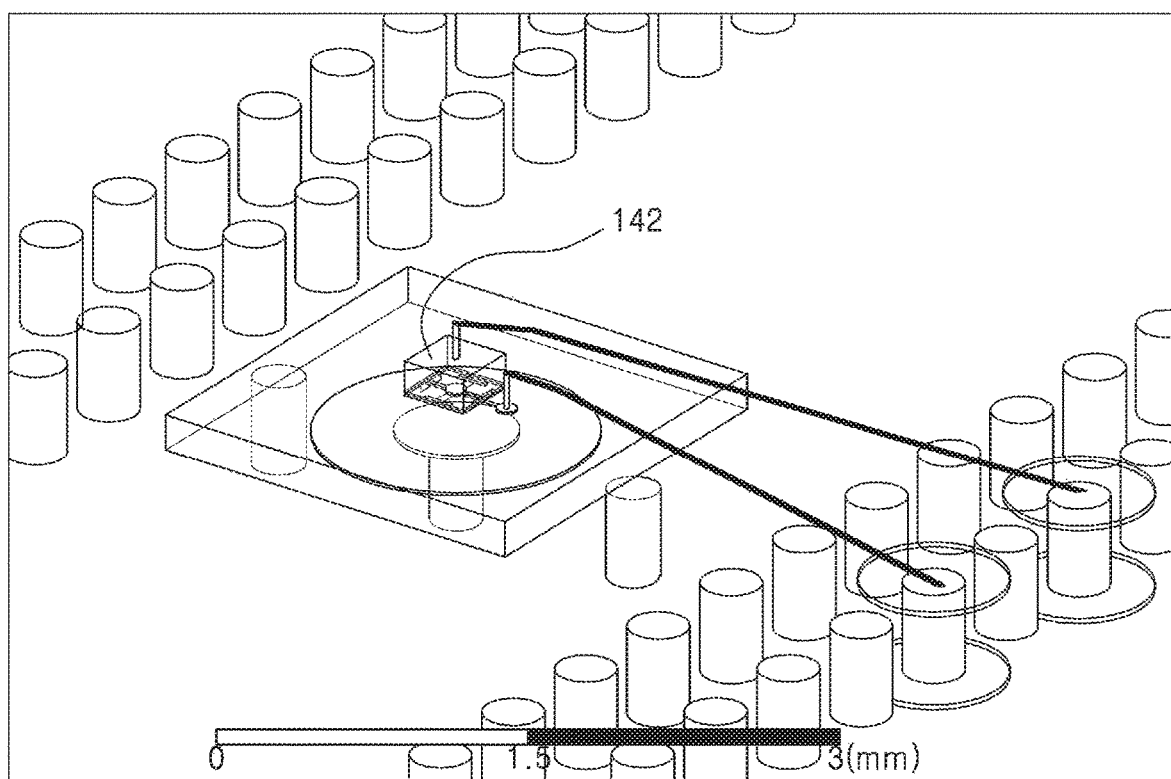

FIGS. 9A, 9B, and 9C are diagrams for explaining the light source 14 providing light to a PSE according to an embodiment of the disclosure.

Referring to FIG. 9A, the light source 14 included in an optically-controlled switch 300 according to an embodiment may be the uLEDs 14 but is not limited thereto. The uLEDs 14 may have two contacts located on its opposite sides. One contact may a direct contact with a first feeding pin of the control circuit 13 and the other contact may include an additional feed conductor 18 for connecting to a second feeding pin of the control circuit 13. At this time, to avoid electrical connection of the feed conductor 18 with the PSE 1, a dielectric transparent splitter 16 may be located between the uLEDs 14 and the PSE 1. The feed conductor 18 may also be placed inside the dielectric transparent splitter 16 without a contact with the PSE 1. The dielectric transparent splitter 16 may be manufactured from silicone but is not limited thereto. Also, the dielectric transparent splitter 16 may be used as a light guide to provide light generated by the uLEDs 14 to the PSE 1. In an embodiment, the thickness of the dielectric transparent splitter 16 between the uLEDs 14 and the PSE 1 may consist of units of um.

Meanwhile, referring to FIG. 9A, contacts 17 may be located in a lower portion of the PSE 1. The contacts 17 may formed of metal (e.g., copper) and may be areas which are intended for connection of the PSE 1 to the shunt via 6 and the upper layer 3 of the printed circuit board.

Referring to FIGS. 9B and 9C, an optically-controlled switch 400 according to an embodiment may be implemented as a more compact switch in which an uLED chip 142 is used as a light source. In this regard, in the uLED chip 142, an anode and cathode may be isolated from each other by a semiconductor (p-n transition area) and may usually be on its different sizes. A bottom side of the uLED chip 142 may be glued by transparent conducting glue to the anode (or cathode) of the PSE 1. At this time, a layer glued by the transparent conducting glue may have a thin thickness (about nm-um). An upper side of the PSE 1 may be metalized for providing galvanic coupling, taking into account the glue conductance, with the anode (or cathode) of the uLED chip 142. The anode and cathode of the uLED-chip 142 may be welded using standard technologies on a SIW PCB coupled with the feed control system of the uLED-chip 142. Also, all construction may be coated by a protective dielectric coating, for example, silicone 16.

Figure 10:
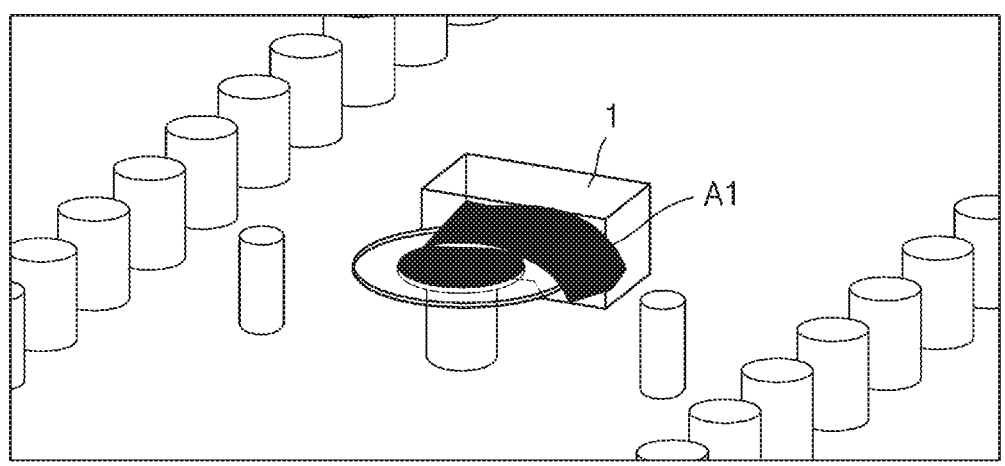
FIG. 10 shows the current distribution in an optically-controlled switch according to an embodiment of the disclosure.

FIG. 10 shows the current distribution in an optically-controlled switch according to an embodiment of the disclosure.

Referring to FIG. 10, the current distribution (a shaded area A1 in the PSE 1) of FIG. 1 may shows the most reasonable and efficient zone for the PSE 1 to provide transition to a conducting state and providing of a required conductance level. A depth of current propagation (and, correspondingly, an optimal thickness of the PSE 1) may be determined according to the thickness of a skin-layer on the given frequency of electromagnetic waves propagating into the SIW and provided by conductance of the PSE 1.

The construction of the optically-controlled switch of FIGS. 9B and 9C, taking into account the volume current distribution in the PSE 1 in target placement may be ultra-compact as compared to the solutions known from the related art and thus this may allow simple integration in compact devices, complexity reduction, as well as power consumption optimization.

Figure 11:
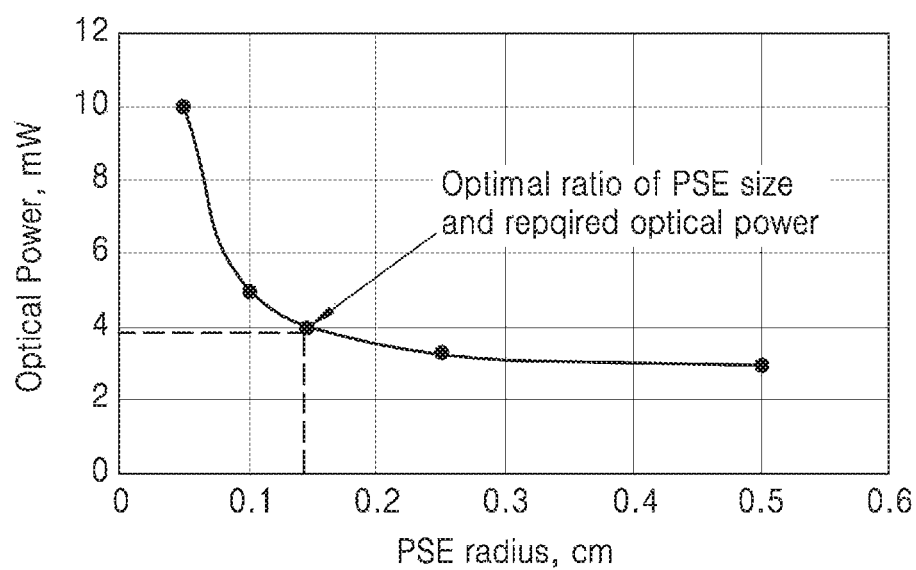
FIGS. 11 and 12 show the dependency of the required optical energy on sizes of PSEs included in an optically-controlled switch according to an embodiment of the disclosure.
Figure 12:
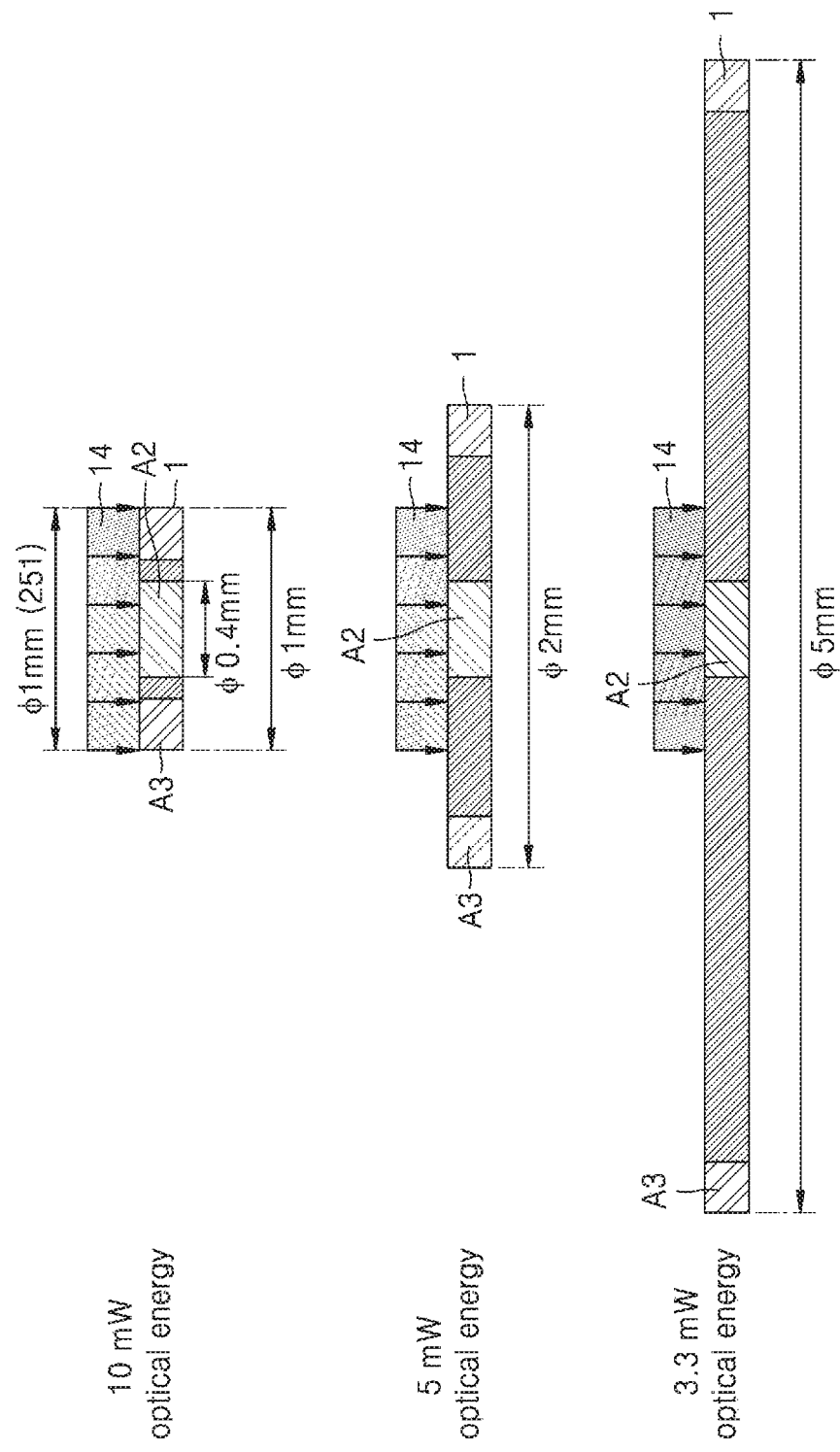

FIGS. 11 and 12 show the dependency of the required optical energy on sizes of PSEs included in an optically-controlled switch according to an embodiment of the disclosure.

Figure 13A:
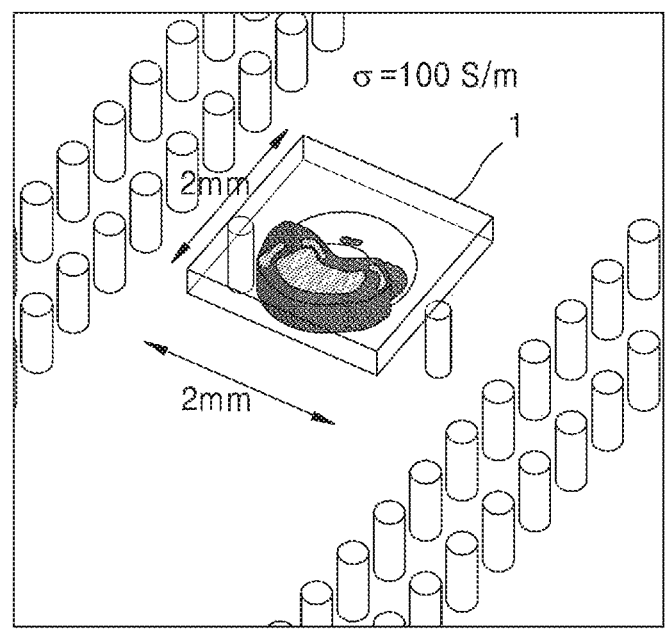
FIGS. 13A and 13B show current distribution when an optically-controlled switch operates as a distributed element according to an embodiment of the disclosure.
Figure 13B:
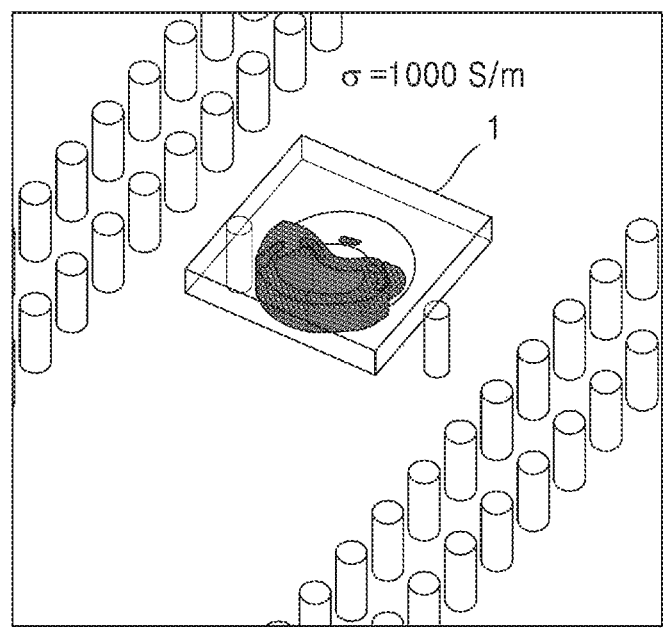

FIGS. 13A and 13B show current distribution when an optically-controlled switch operates as a distributed element according to an embodiment of the disclosure.

A ratio of sizes of the light source 14 and the PSE 1 included in the optically-controlled switch according to an embodiment of the disclosure may exert influence on the required value of optical energy. Referring to FIG. 11, the optimal radius of the PSE 1 may be a value approximately 1.4 mm (i.e. the diameter is 2.8 mm). Also, at this time, optical energy of approximately 3.8 mW may be required for lighting. In case of reducing the size of the PSE 1, the required value of optical energy multiply may increase, whereas in case of increasing the size of the PSE 1, the required value of optical energy may be almost not reduced.

Also, referring to FIG. 12, different optical energy may be required for providing a conducting state of the PSE 1 with the same size of the light source (e.g. uLED) 14 and different sizes of the PSE 1. In the same size of the light source 14, the size of a light spot 251 and zone, in which the given conductance level is provided, taking into account the volume current distribution in the PSE 1 of FIG. 10, may be the same. As a result, reduction of optical energy of more than 2 times may be achieved due to optimization of ratio of longitudinal sizes of the light source 14 and the PSE 1.

This reduction effect of optical energy may be achieved by diffusion of electrons transitioned in the conductance zone under the influence of light and diffusing in the PSE 1, as well as by reducing the influence of edge effects associated with damage of the molecular structure of semiconductor in its mechanical cutting during manufacturing. As a result, in a zone A3 where the edge effects occur, electrons may have less life time, which requires higher optical energy to bring the whole semiconductor material into the conducting state. Thus, it may be required to provide more optical power to compensate the influence of edges and provide the given conductance level in the desired zone. However, in case of increasing the size of the PSE 1, the influence of edges may be reduced, which may allow obtaining the required conductance in wider zone by electron diffusion conductance, using the same light source.

From the other side, when the same zone of the given conductance is obtained by using the enlarged size of the PSE 1, and the consumed optical energy of the light source may be reduced. For example, as shown in FIG. 12, when the required conductance is obtained in the same zone A2 while increasing the size of the PSE 1 and the size of the light source 14 is the same, the required optical energy may be reduced.

Calculation of concentration of photoconductive electrons n in the PSE 1 taking into account electron diffusion and edge effects is presented below:

$$\Delta_2 n - \frac{n}{s^2} = -\Phi \text{- Helmholtz equation}$$

$$\frac{1}{r}\frac{d}{dr}\left(r\frac{dn}{dr}\right) - \frac{n}{s^2} = -\Phi \text{- azimuthal symmetry}$$

$$s^2 = D\tau$$

s—Diffusion length,
D—Diffusion constant,
τ—Electron life time in a semiconductor,
Φ—Lighting function Solution for third type boundary condition assuming homogeneity of the carrier density distribution across the thickness (direction z)

$$\frac{dn}{dr} + \frac{SRV}{D}n = 0 \mid_{r=R} \text{- boundary condition}$$

However, in case of increasing the size of the PSE 1 up to the values approximately more than λ/4, the PSE 1 may become distributed resistance medium other than a concentrated element. The distributed resistance medium may change depending on the resistance of the PSE 1 detected in the volume current distribution in the PSE 1, and consequently may change on its conductance. For example, as shown in FIG. 13A. the best key isolation may be provided at the most current propagation in the PSE 1 at more values of resistance of the PSE 1 (at less values of the conductance), whereas at less values of the resistance of the PSE 1 (at more values of the conductance), currents may propagate in the less depth of the PSE 1, which may provide less cut-off level of the optically-controlled switch according to an embodiment.

Figure 14:
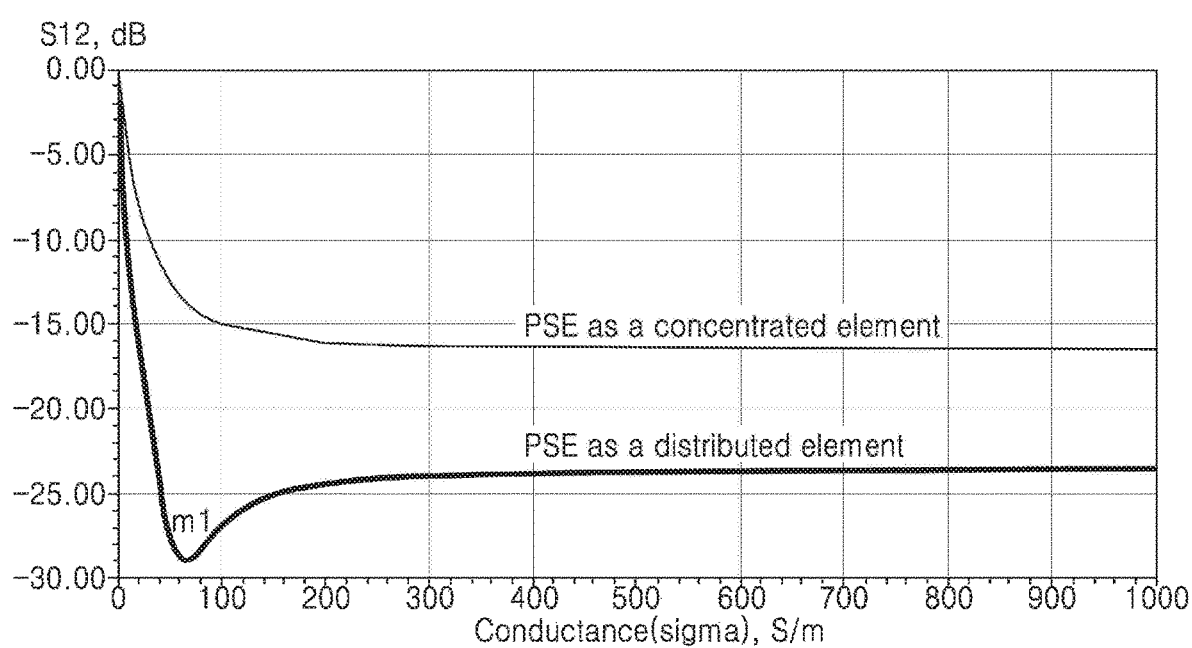
FIG. 14 is a graph of transfer coefficients with respect to conductance when an optically-controlled switch operates as a concentrated and distributed element according to an embodiment of the disclosure.

FIG. 14 is a graph of transfer coefficients with respect to conductance when an optically-controlled switch operates as a concentrated and distributed element according to an embodiment of the disclosure.

Referring to FIG. 14, when the optically-controlled switch according to an embodiment operates as the distributed element, an optimal value (ml) of the conductance of the PSE 1 may exist. Thus, it may be possible to additionally optimize the level of optical power consumed for transitioning the PSE 1 into a conducting state.

By controlling the size of the PSE 1, and correspondingly, carrier life time in the given conductance zone, it may be also possible to control switching-on/off time of the optically-controlled switch. Bigger carrier life time in volume of the PSE 1 may mean longer switching-on/off of the PSE 1. Vice versa, the PSE 1 having less volume carrier life time at sufficient optical power may faster transition into the switched-on and switched-off state. Thus, by moving element edges closer/away of the zone, in which the given conductance level is required to provide, it may be possible to increase/reduce volume carrier life time and increase/reduce final switching-on/off time of the switch due to recombination edge effects. Therefore, depending on purposes of a device using the optically-controlled switch, by selecting of geometric parameters of the PSE 1 and a light source, it may be possible to optimize the consumed optical power of the switch and its switching-on/off time.

Figure 15A:
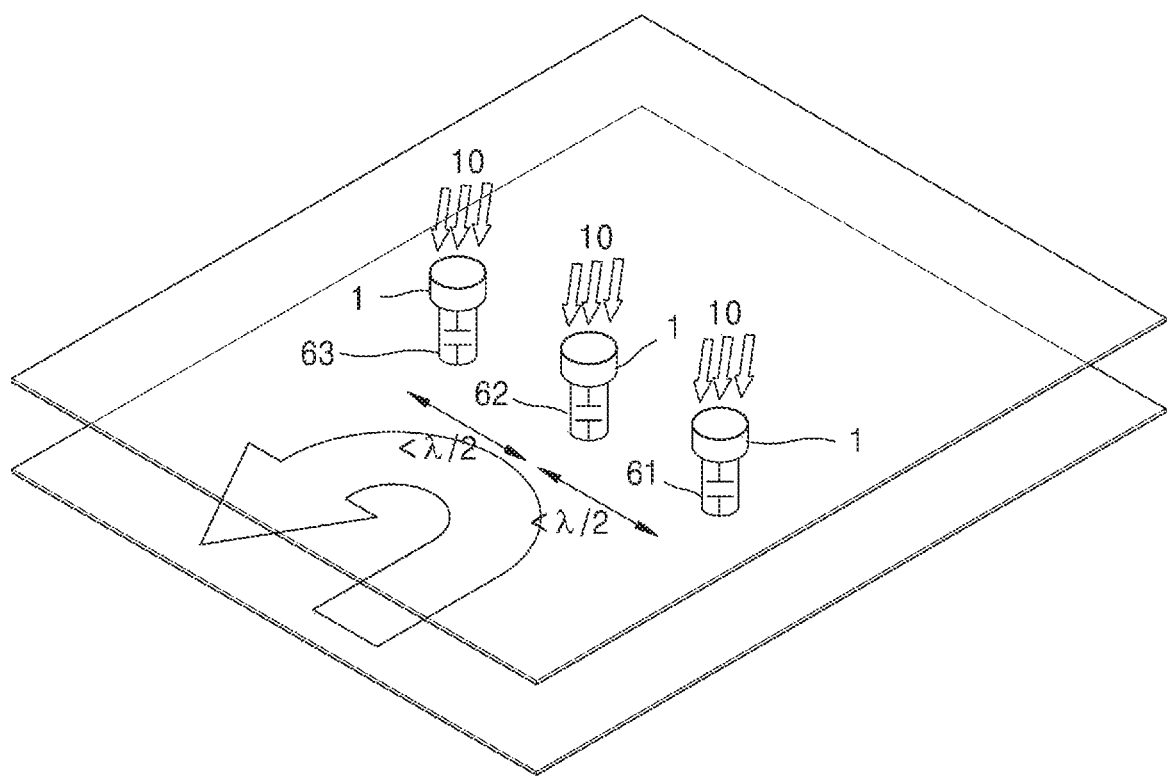
FIGS. 15A and 15B show an optically-controlled switch according to an embodiment of the disclosure.
Figure 15B:
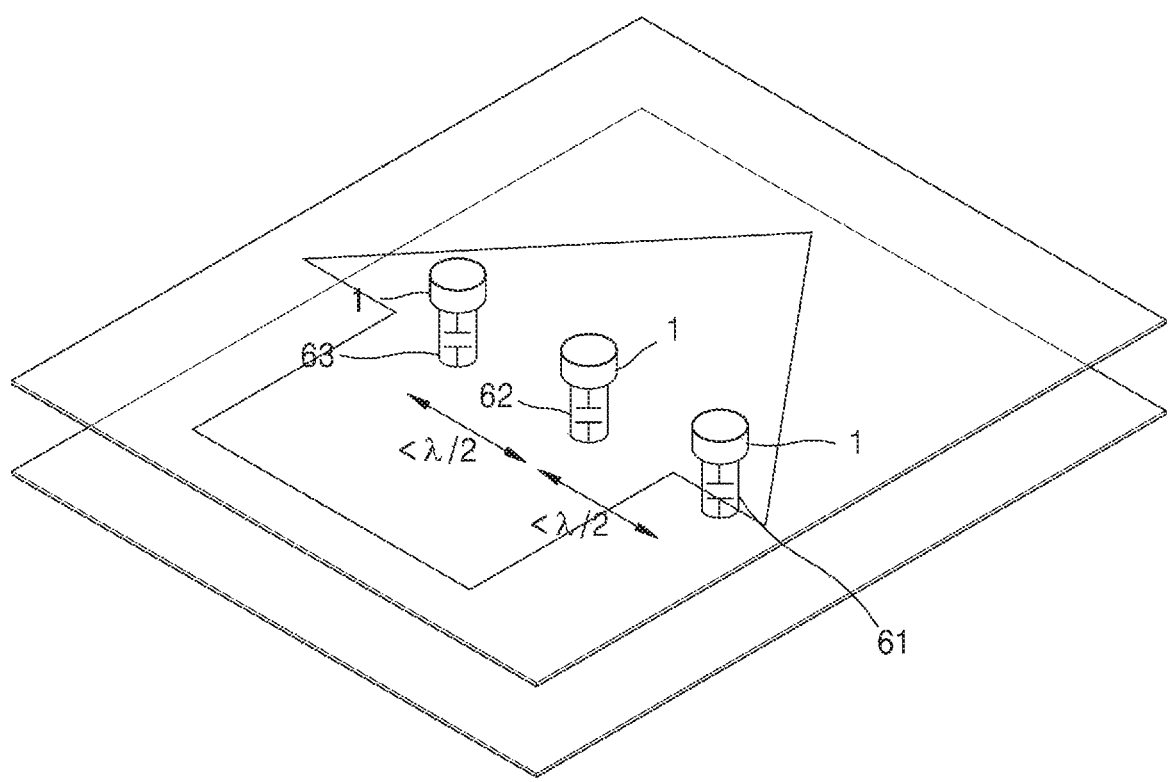

FIGS. 15A and 15B show an optically-controlled switch according to an embodiment of the disclosure.

Referring to FIGS. 15A and 15B, the optically-controlled switch according to an embodiment may be a switch controlling a SIW.

The optically-controlled switch according to an embodiment may include a plurality of shunt vias 61, 62, and 63. The PSE 1 may be coupled onto the plurality of shunt vias 61, 62, and 63. The adjacent shunt vias among the plurality of shunt vias 61, 62, and 63 may be located at a distance of $<\lambda/2$ of EM waves propagating the SIW. Accordingly, when the optically-controlled switch is in an ON state (the light source 10 is provided to the PSE 1), reflecting areas may be formed (FIG. 15A). To the contrary, when the optically-controlled switch is in an OFF state (no light source is provided to the PSE 1), the EM waves may freely propagate the SIW.

FIGS. 16A, 16B, 16C, 16D, 16E, 16F, and 16G show examples of PSEs having various sizes, forms, and locations in an optically-controlled switch according to various embodiments of the disclosure.

Size, form and location of the PSE 1 in the optically-controlled switch may be variously implemented. The size, form and location of the PSE 1 may be determined by the SIW structure and areas of flowing currents for efficient switching, convenience of element arrangement for mounting and requirements to isolation. The light source 14 may be located above the center of the PSE 1 or shifted to its edge. Also, the PSE 1 may completely or partially overlap the shunt via 6, have a contact with an upper layer of a PCB and do not overlap the resonant vias 15.

Figure 16A:
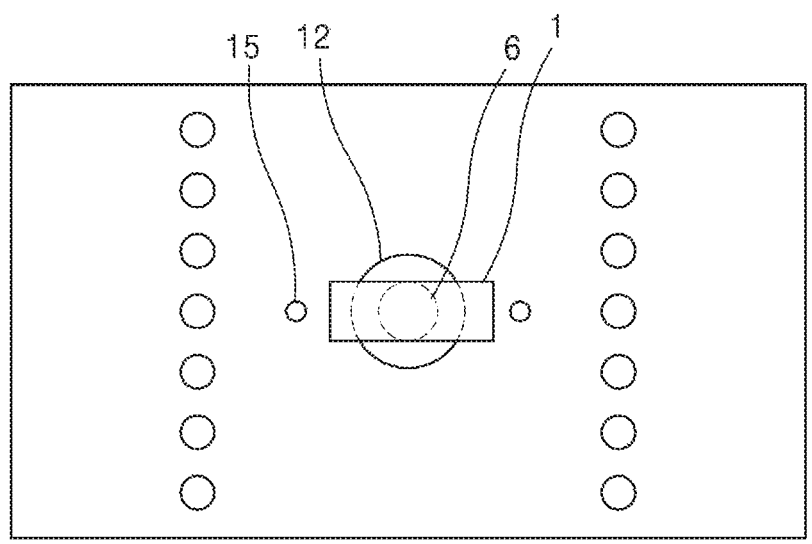
FIGS. 16A, 16B, 16C, 16D, 16E, 16F, and 16G show examples of PSEs having various sizes, forms, and locations in an optically-controlled switch according to an embodiment of the disclosure.

Referring to FIG. 16A, the PSE 1 may be made rectangular and located substantially perpendicular to the waveguide axis. The width of the PSE 1 may be approximately equal to the diameter of the shunt via 6.

Figure 16B:
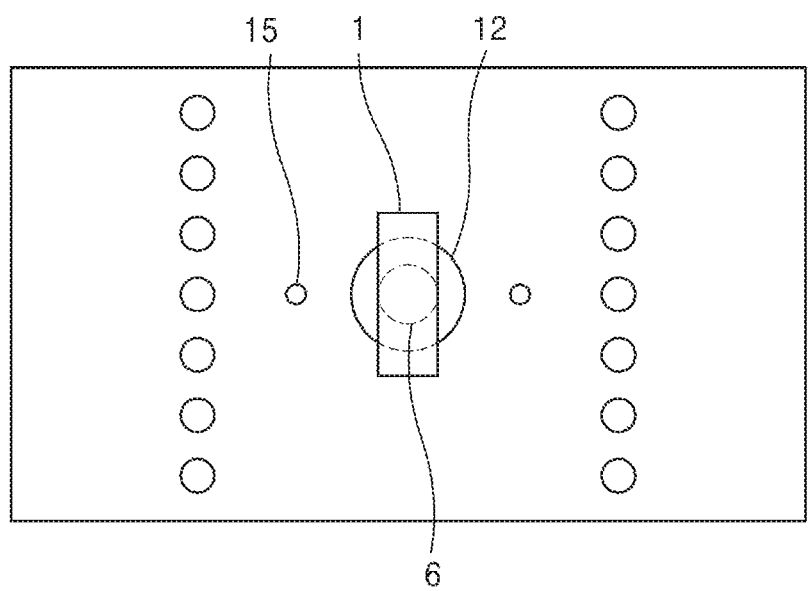

Referring to FIG. 16B, the PSE 1 may be made rectangular and located substantially parallel to the waveguide axis. The width of the PSE 1 may be approximately equal to the diameter of the shunt via 6.

Figure 16C:
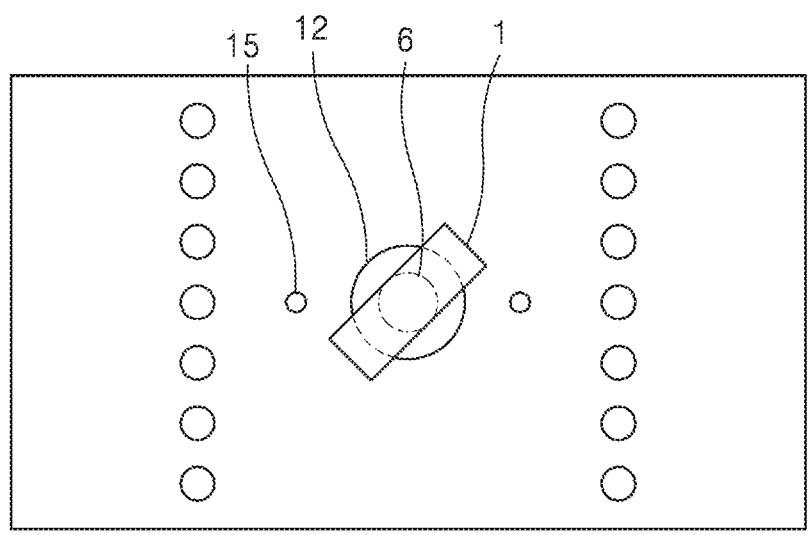

Referring to FIG. 16C, the PSE 1 may be made rectangular and located at an angle to the waveguide axis. The width of the PSE 1 may be approximately equal to the diameter of the shunt via 6.

Figure 16D:
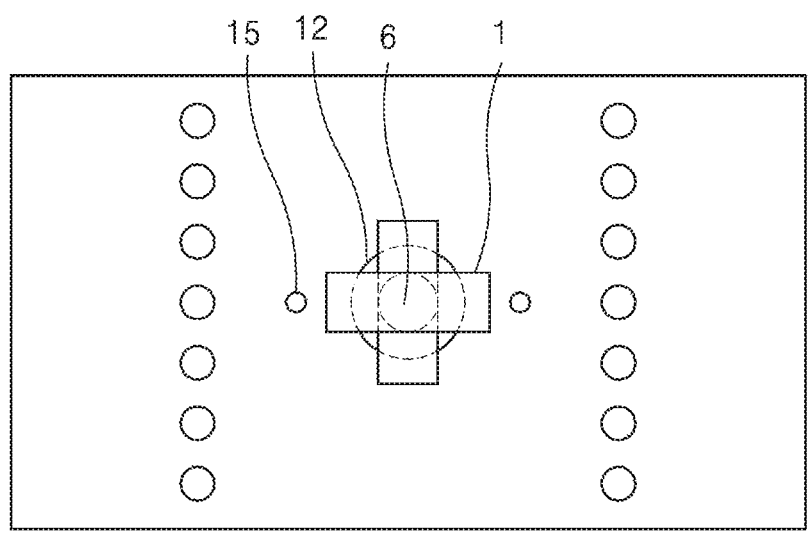

Referring to FIG. 16D, the PSE 1 may have a complex shape, for example cross-like shape. The arm width of the PSE 1 may be approximately equal to the diameter of the shunt via 6.

Figure 16E:
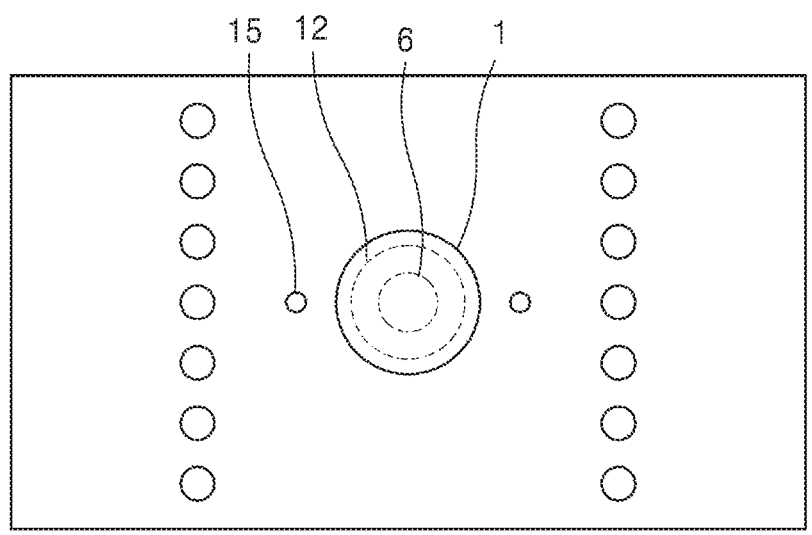

Referring to FIG. 16E, the PSE 1 may be made round. The diameter of the PSE 1 may be larger than the diameter of the shunt via 6 and the dielectric gap 12, and thus the PSE 1 may completely overlap the shunt via 6 and the dielectric gap 12.

Figure 16F:
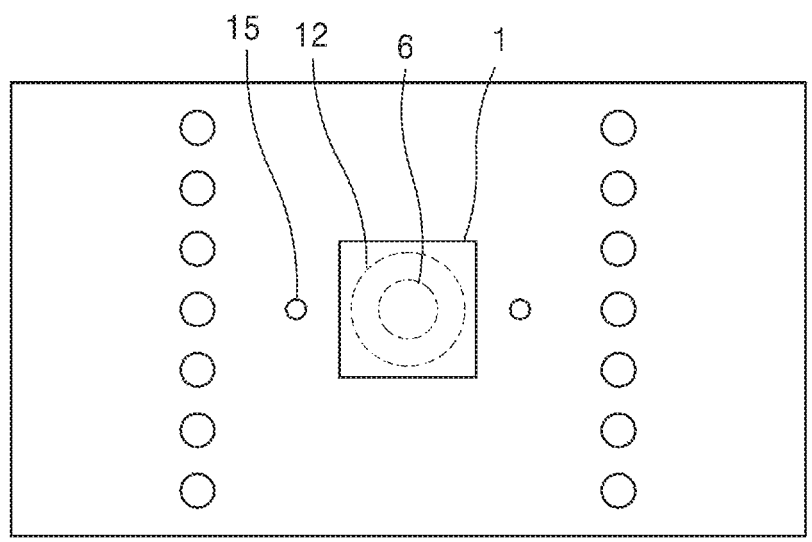

Referring to FIG. 16F, the PSE 1 may be made square. The side length of the PSE 1 may be larger than the diameter of the shunt via 6 and the dielectric gap 12, and thus the PSE 1 may completely overlap the shunt via 6 and the dielectric gap 12.

Figure 16G:
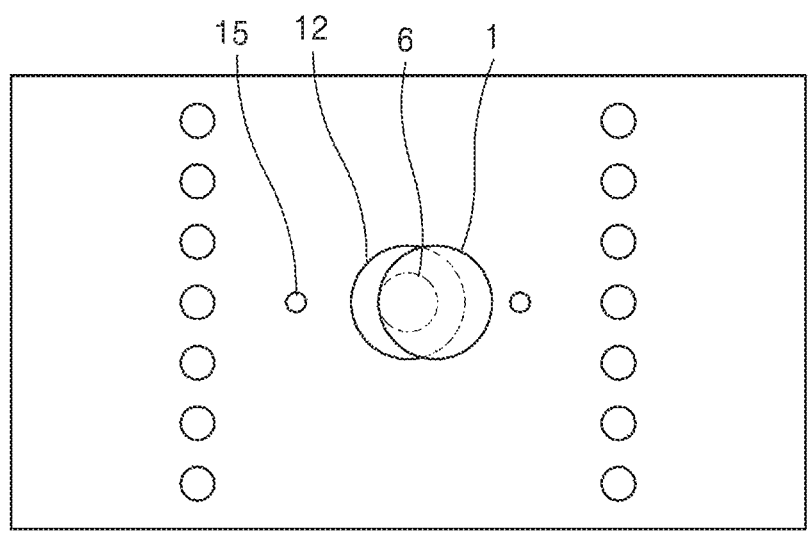

Referring to FIG. 16G, the PSE 1 may be made round. The diameter of the PSE 1 may be larger than the diameter of the shunt via 6 and approximately equal to the diameter of the dielectric gap 12, while the PSE 1 may completely overlap the shunt via 6 and partially overlap the dielectric gap 12.

Figure 17:
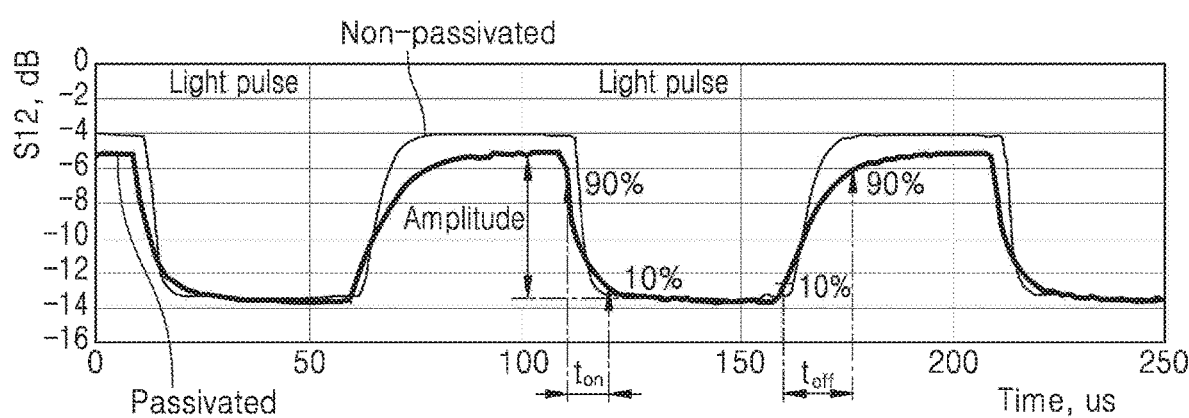
FIG. 17 is a graph of switching time of an optically-controlled switch according to an embodiment of the disclosure.

FIG. 17 is a graph of switching time of an optically-controlled switch according to an embodiment of the disclosure.

A PSE included in the optically-controlled switch according to an embodiment may include various types of semiconductors, for example, silicon, InGaAs and others. The switching time of the optically-controlled switch may be determined (ton and toff~$\tau$) according to electron life time $\tau$ of a material of the PSE. At this time, the electron life time $\tau$ may be reduced by material passivation (e.g. surface treatment). Meanwhile, since carrier life time is inversely proportional to optical energy Popt~$1/\tau$, reducing switching time may require more optical power and accordingly increase energy consumption.

An example of passivation influence on switching-on/off time of the optically-controlled switch is expressed in FIG. 17 and in Table 1 below.

TABLE 1

| Material of the optically-controlled switch | ton, μs | toff, μs |
| --- | --- | --- |
| Passivated Silicon | 9.6 | 20.1 |
| Unpassivated Silicon | 3.1 | 10.6 |

Switching-on and switching-off time ton and toff may be reduced as follows.

1. Photoconductive material optimization (depends on the carrier life time)
   Modification of Silicon (purity optimization, doping)
   Another material usage (for example, InGaAs)
2. Switch structure optimization
   Control of the dielectric gap 12
   Considering the volume current distribution in the photoconductive material and electromagnetic edge effects.

Although the configuration of an optically-controlled switch for a SIW and basic embodiments thereof are described above, various modifications and improvements of one of ordinary skill in the art using the principles also belong to the scope of the present disclosure.

APPLICABILITY

The optically-controlled switch according to an embodiment may be used in mm-wave devices. For example, the optically-controlled switch may be used in striplines, circulators, phase shifters, switches and antennas for adaptive beam-forming. Also, the optically-controlled switch according to an embodiment may be used in devices requiring control of RF-signals, for example, mobile communication networks of next generation standards 5G and WiGig, different types of sensors, smart home systems for wireless energy transmission, including on large distances, other intelligent systems adaptive to a mm-wave range, car navigation, internet of things (IoT), wireless power charging, etc.

It should be appreciated that although herein such terms as "first", "second", "third", etc. may be used to describe various elements, components, regions, layers and/or sections, these elements, components, regions, layers and/or sections should not be limited by these terms. These terms are only used to distinguish one element, component, region, layer or section from another element, component, region, layer or section. So, the first element, component, region, layer or section may be termed a second element, component, region, layer or section without going beyond the scope of the present disclosure. In the present description, the term "and/or" includes any and all combinations of one or more of the respective listed items. The elements referred to in the singular do not exclude a plurality of elements, unless otherwise specified.

Functionality of the element specified in the description or the claims as a single element can be implemented in practice through several components of the device, and vice versa, functionality of the elements specified in the description or claims as multiple separate elements can be implemented in practice by a single component.

In an embodiment, the elements/units of the present optically-controlled switch are disposed in a common housing, placed on the same frame/structure/printed circuit board and connected to each other structurally by mounting (assembly) operations and functionally via communication lines. The communication lines or channels, unless specified otherwise, may be conventional communication lines, the material implementation of which generally does not require creative effort. Communication line may be wire, set of wires, bus, path, wireless communication link (inductive, radio frequency, infrared, ultrasonic, etc.). Communication protocols over the communications links are known in the art and not disclosed separately.

Functional relationship of elements should be understood as a connection providing correct cooperation of these elements with each other and implementing a particular functionality of elements. Particular examples of functional relationship may be a connection providing exchange of information, a connection providing transmission of electric current, a connection providing transfer of mechanical motion, a connection providing transmission of light, sound, electromagnetic or mechanical vibrations, etc. The specific form of functional relationship is determined by the nature of interaction of the elements, and, unless otherwise specified, is provided by well-known means using the principles well-known in the art.

The optically-controlled switch according to an embodiment may be easily integrated into the SIW, has low power loss, and is capable of complete shielding of electromagnetic waves. As a result, SIW technology may be used efficiently in applications using an mm-wave range.

It should be understood that embodiments described herein should be considered in a descriptive sense only and not for purposes of limitation. Descriptions of features or aspects within each embodiment should typically be considered as available for other similar features or aspects in other embodiments.

While the disclosure has been described with reference to various embodiments thereof, it will be understood by those skilled in the art that various changes in form and details may be made therein without departing from the spirit and scope of the disclosure as defined by the appended claims and their equivalents.

What is claimed is:

1. An optically-controlled switch, comprising:
   a printed circuit board (PCB) comprising upper and lower layers and a dielectric layer between the upper and lower layers,
   a plurality of vias electrically connected to the upper and lower layers, the plurality of vias comprising a first row of vias and a second row of vias forming a waveguide;
   a shunt via electrically connected to the lower layer and separated from the upper layer by a dielectric gap; and
   a photoconductive semiconductor element (PSE) electrically connected to the upper layer and the shunt via,
   wherein the PSE includes a dielectric state and a conductor state, and
   wherein the PSE selectively propagates or blocks through the waveguide, an electromagnetic wave provided to the optically-controlled switch, based on a state of the PSE.

2. The optically-controlled switch of claim 1, wherein a distance between adjacent vias among the plurality of vias is less than one tenth of a wavelength of the electromagnetic wave.

3. The optically-controlled switch of claim 1,
   wherein the first row of vias and the second row of vias form waveguide walls, and
   wherein a distance between the first row of vias and the second row of vias is larger than half of a wavelength of the electromagnetic wave.

4. The optically-controlled switch of claim 1, further comprising:
   an input port configured to input the electromagnetic wave; and
   an output port configured to output the electromagnetic wave,
   wherein the input port is located at one end of the waveguide and the output port is located at another end of the waveguide.

5. The optically-controlled switch of claim 1,
   wherein, when the PSE is in the dielectric state, the electromagnetic wave propagates through the waveguide, and
   wherein, when the PSE is in the conductor state, the electromagnetic wave is blocked.

6. The optically-controlled switch of claim 1, further comprising:
   a light source connected to the PSE and configured to provide light to the PSE,
   wherein, when the light is provided to the PSE, the PSE is in the conductor state, and
   wherein, when the light is not provided to the PSE, the PSE is in the dielectric state.

7. The optically-controlled switch of claim 6, wherein the light source comprises a micro light-emitting diode (LED).

8. The optically-controlled switch of claim 6,
   wherein the PSE comprises a metalized area, wherein the light source is connected to the metalized area,
wherein the optically-controlled switch further comprises:
   a protective dielectric coating configured to completely cover the light source and the PSE;
   a first feed conductor located inside the protective dielectric coating and configured to connect the metalized area to a control circuit; and
   a second feed conductor located inside the protective dielectric coating and configured to connect the light source and the control circuit, and
wherein the first and second feed conductors are isolated from each other.

9. The optically-controlled switch of claim 6, further comprising:
   a control circuit connected to the light source and configured to control a state of the light source.

10. The optically-controlled switch of claim 9, further comprising:
   a dielectric transparent splitter located between the PSE and the light source; and
   a feed conductor located inside the dielectric transparent splitter and configured to connect the light source and the control circuit,
   wherein the feed conductor does not contact the PSE.

11. The optically-controlled switch of claim 6, wherein a size of a light spot of the light source is 3 to 6 times less than a diameter of the PSE.

12. The optically-controlled switch of claim 1, further comprising:
   a plurality of resonant vias located between the shunt via and the plurality of vias and electrically connected to the upper and lower layers.

13. The optically-controlled switch of claim 1, wherein the PSE is passivated.

14. The optically-controlled switch of claim 1,
wherein the PSE comprises a rectangular shape, and
wherein a width of the PSE is equal to a diameter of the shunt via.

15. The optically-controlled switch of claim 1,
wherein the PSE comprises a cross-like shape, and
wherein an arm width of the PSE is equal to a diameter of the shunt via.

16. The optically-controlled switch of claim 1,
wherein the PSE comprise a round shape,
wherein a diameter of the PSE is larger than a diameter of the shunt via and larger than a diameter of the dielectric gap, and
wherein the PSE completely overlaps the shunt via and the dielectric gap.

17. The optically-controlled switch of claim 1,
wherein the PSE comprises a square shape,
wherein a side length of the PSE is larger than a diameter of the shunt via and larger than a diameter of the dielectric gap, and
wherein the PSE completely overlaps the shunt via and the dielectric gap.

18. The optically-controlled switch of claim 1,
wherein the PSE comprises a round shape,
wherein a diameter of the PSE is larger than a diameter of the shunt via and is equal to a diameter of the dielectric gap, and
wherein the PSE completely overlaps the shunt via and partially overlaps the dielectric gap.

* * * * *